(12) United States Patent
Wang et al.

(10) Patent No.: US 10,514,500 B2
(45) Date of Patent: Dec. 24, 2019

(54) DEVICE INTEGRATING SUSPENDED LED, OPTICAL WAVEGUIDE AND PHOTOELECTRIC DETECTOR ON SAME CHIP, AND FABRICATION METHOD THEREOF

(71) Applicant: NANJING UNIVERSITY OF POSTS AND TELECOMMUNICATIONS, Nanjing (CN)

(72) Inventors: Yongjin Wang, Nanjing (CN); Guixia Zhu, Nanjing (CN); Dan Bai, Nanjing (CN); Jialei Yuan, Nanjing (CN); Yin Xu, Nanjing (CN)

(73) Assignee: Nanjing University of Posts and Telecommunications, Nanjing (CN)

( * ) Notice: Subject to any disclaimer, the term of this patent is extended or adjusted under 35 U.S.C. 154(b) by 0 days.

(21) Appl. No.: 15/984,679

(22) Filed: May 21, 2018

(65) Prior Publication Data
US 2018/0275340 A1 Sep. 27, 2018

Related U.S. Application Data

(63) Continuation of application No. PCT/CN2016/080091, filed on Apr. 23, 2016.

(30) Foreign Application Priority Data

Nov. 20, 2015 (CN) .......................... 2015 1 0816501

(51) Int. Cl.
*G02B 6/26* (2006.01)
*G02B 6/12* (2006.01)
(Continued)

(52) U.S. Cl.
CPC .............. *G02B 6/122* (2013.01); *H01L 27/15* (2013.01); *H01L 33/06* (2013.01); *H01L 33/12* (2013.01);
(Continued)

(58) Field of Classification Search
CPC .......... G02B 6/136; G02B 2006/12061; G02B 2006/12097; G02B 6/1223;
(Continued)

(56) References Cited

U.S. PATENT DOCUMENTS

2002/0074553 A1* 6/2002 Starikov ............... H01L 31/108
257/77
2013/0136392 A1 5/2013 Huo

FOREIGN PATENT DOCUMENTS

| CN | 103779452 A | 5/2014 |
|----|-------------|--------|
| CN | 104065417 A | 9/2014 |

(Continued)

OTHER PUBLICATIONS

International Search Report dated Aug. 26, 2016 for PCT/CN2016/080091, 6 pages.

*Primary Examiner* — Kaveh C Kianni
*Assistant Examiner* — Hung Q Lam
(74) *Attorney, Agent, or Firm* — Arch & Lake LLP

(57) ABSTRACT

An integrated device and a fabrication method thereof are provided. In the device, by using various anisotropic silicon etching techniques, the silicon substrate layer and the epitaxial buffer layer under the device structure are removed, an ultra-thin device monolithically integrated with a suspended LED, an optical waveguide and a photodetector is obtained by further using the nitride back thinning etching technique. In the device, the light source, the optical waveguide and the photodetector are integrated on the same chip. The light emitted by the LED is laterally coupled to the optical waveguide, transmitted over the optical waveguide, and detected by the photodetector at the other end of the optical waveguide, thereby achieving a planar photon monolithically integrated device which is applied in the fields of optical transmission and optical sensing.

4 Claims, 2 Drawing Sheets

(51) Int. Cl.
*G02B 6/10* (2006.01)
*G02B 6/42* (2006.01)
*G02B 6/122* (2006.01)
*H01L 27/15* (2006.01)
*H01L 33/06* (2010.01)
*H01L 33/12* (2010.01)
*H01L 33/30* (2010.01)
*H01L 33/40* (2010.01)

(52) U.S. Cl.
CPC ...... *G02B 6/42* (2013.01); *G02B 2006/12061* (2013.01); *H01L 33/30* (2013.01); *H01L 33/40* (2013.01); *H01L 2933/0016* (2013.01)

(58) Field of Classification Search
CPC ........... G02B 2006/12035; G02B 2006/12078; G02B 2006/12121; G02B 2006/12123
USPC .................................................... 385/50, 130
See application file for complete search history.

(56) References Cited

FOREIGN PATENT DOCUMENTS

| | | |
|---|---|---|
| CN | 105428305 A | 3/2016 |
| WO | 2015108488 A1 | 7/2015 |

* cited by examiner

DEVICE INTEGRATING SUSPENDED LED, OPTICAL WAVEGUIDE AND PHOTOELECTRIC DETECTOR ON SAME CHIP, AND FABRICATION METHOD THEREOF

CROSS-REFERENCE TO RELATED APPLICATION

This application is a continuation of International Application No. PCT/CN2016/080091, filed on Apr. 23, 2016, which is based upon and claims priority to Chinese Patent Application No. 201510816501.1, filed on Nov. 20, 2015, the entire contents of which are incorporated herein by reference.

TECHNICAL FIELD

The present disclosure relates to the technical field of information materials and devices, and in particular, relates to a device monolithically integrated with a suspended LED, an optical waveguide and a photodetector, and a fabrication method thereof.

BACKGROUND

Nitride materials, particularly the GaN material, have the functions of light emission, transmission and detection. Therefore, it is possible to fabricate monolithically integrated planar photons based on silicon substrate nitride materials. By stripping the silicon substrate, optical waveguide devices with optical limiting properties may be practiced based on the high refractive index property of the nitride material. In the meantime, the performance of suspended nitride LEDs and photodetectors may also be greatly improved. Based on the silicon substrate nitride materials, by using the silicon etching technique, the silicon substrate is stripped and the suspended nitride thin film is further thinned to obtain an ultra-thin nitride monolithically integrated device, wherein the LED, the optical waveguide and the photodetector are integrated on the same chip. The light emitted by the LED is laterally coupled to the optical waveguide, transmitted over the optical waveguide, and detected by the photodetector at the other end of the optical waveguide, thereby achieving a planar photon monolithically integrated device. This provides a foundation for the development of the nitride photons and optical microelectromechanical devices oriented to optical communication and optical sensing.

SUMMARY

Technical Problem

The present disclosure provides a device monolithically integrated with a suspended LED, an optical waveguide and a photodetector, wherein the light source, the optical waveguide and the photodetector are integrated on the same chip. The light emitted by the LED is laterally coupled to the optical waveguide, transmitted over the optical waveguide, and detected by the photodetector at the other end of the optical waveguide, thereby achieving a planar photon monolithically integrated device. The present disclosure further provides a method for fabricating the device.

Technical Solutions

The device monolithically integrated with a suspended LED, an optical waveguide and a photodetector according to the present disclosure is carried on a silicon-based nitride wafer, and comprises: a silicon substrate layer, an epitaxial buffer layer arranged on the silicon substrate layer, an LED device arranged on the epitaxial buffer layer and a photodector; the LED and the photodetector are connected via an optical waveguide, and the LED and the photodetector are both formed by a p-n junction, a p-electrode and an n-electrode; wherein the p-n junction comprises an n-GaN layer, an InGaN/GaN quantum well and a p-GaN layer that are sequentially connected from bottom to top, the p-electrode is arranged on the p-GaN layer, a step-shaped stage is etched on an upper surface of the n-GaN layer, the step-shaped stage comprises an upper stage and a lower stage arranged on the upper stage, the upper stage is connected to a bottom face of the InGaN/GaN quantum well, and the n-electrode is arranged on the lower stage; an isolation trench for dividing the optical waveguide into two parts is arranged on the optical waveguide, wherein one part is connected to the LED and the other part is connected to the photodetector, and a cavity opposite to the p-electrode, the n-electrode and the optical waveguide and passing through the silicon substrate layer and the expitaxial buffer layer to a bottom face of the n-GaN layer is arranged below the n-GaN layer, such that the LED, the photodetector and the optical waveguide are suspended.

Further, in the device monolithically integrated with a suspended LED, an optical waveguide and a photodetector according to the present disclosure, the p-electrode is formed by a suspended p-electrode region, a p-electrode conductive region and a p-electrode wiring region that are sequentially connected, and the n-electrode is formed by an n-electrode conductive region and an n-electrode wiring region that are connected to each other, and the cavity is arranged under the optical waveguide and the two suspended p-electrode region.

Further, in the device monolithically integrated with a suspended LED, an optical waveguide and a photodetector, the LED, the optical waveguide and the photodetector are all practiced on a nitride layer of the silicon-based nitride wafer.

Further, in the device monolithically integrated with a suspended LED, an optical waveguide and a photodetector according to the present disclosure, the isolation trench is formed by etching the optical waveguide from the p-GaN layer to the n-GaN layer.

Further, in the device monolithically integrated with a suspended LED, an optical waveguide and a photodetector according to the present disclosure, the p-electrode and the n-electrode are both Ni/Au electrodes in which a deposited metal material is Ni/Au.

FIG. 3 is a flowchart of a method for fabricating the device monolithically integrated with a suspended LED, an optical waveguide and a photodetector according to another aspect the present disclosure. The method for fabricating the device monolithically integrated with a suspended LED, an optical waveguide and a photodetector according to the present disclosure comprises the following steps:

step (1): polishing to thin the silicon substrate layer on the back of the silicon-based nitride wafer;

step (2): coating a photoresist layer on the upper surface of the silicon-based nitride wafer, and defining an optical waveguide region and an n-GaN step region on the photoresist layer by using exposure technique, wherein the n-GaN step region comprises a lower stage and an upper stage;

step (3): etching the n-GaN step region and the optical waveguide region by using a reactive ion beam;

step (4): removing the remaining photoresist to obtain a step-shaped stage, an optical waveguide, a p-GaN layer arranged on an upper stage of the LED, a p-GaN layer of the photodetector, an InGaN/GaN quantum well of the LED, and an InGaN/GaN quantum well of the photodetector;

step (5): uniformly coating a photoresist layer on an upper surface of the silicon-based nitride wafer, etching to define a p-electrode window region of the LED and a p-electrode window region of the photodetector that are arranged on the upper stage, an n-electrode window region of the LED and an n-electrode window region of the photodetector that are arranged on the lower stage, vapor depositing Ni/Au on the p-electrode window region and the n-electrode window region respectively to form an Ohmic contact and practice a p-electrode and an n-electrode, and removing the remaining photoresist to obtain the LED and the photodetector;

step (6): uniformly coating a photoresist layer on the upper surface of the silicon-based nitride wafer, and etching in the optical waveguide region to define an isolation trench window region that is arranged between the LED and the photodetector and isolates the optical waveguide region;

step (7): etching from top to bottom the nitride layer to the n-GaN layer to obtain an isolation trench by using a reactive ion beam;

step (8): coating an adhesive on a top layer of the silicon-based nitride wafer to protect the surface device from being damaged during etching, spin coating a photoresist layer on a lower surface of the silicon substrate layer of the silicon-based nitride wafer, and defining a back etching window aligning with and totally covering the optical waveguide, the suspended p-electrode region of the LED and the suspended p-electrode region of the photodetector by the back alignment technique;

step (9): using the epitaxial buffer layer as an etching barrier layer, and etching the silicon-based substrate layer to a lower surface of the epitaxial buffer layer to form a cavity via a back etching window by using the back deep silicon etching technique;

step (10): thinning the nitride on the epitaxial buffer layer and the n-GaN layer from bottom to top by using the nitride back thinning etching technique; and step (11): removing the remaining photoresist to obtain the monolithically integrated device for a suspended LED optical waveguide photodetector.

Further, in the fabrication method, in step (5), vapor deposition of Ni/Au is practiced by lift-off process and nitrogen annealing technique under a temperature of 500±5° C.

Further, in the fabrication method, in step (10), the back thinning etching technique is ion beam bombardment or reactive ion beam etching technique.

Further, in the fabrication method according to the present disclosure, the p-electrode window region defined in step (5) comprises a suspended p-electrode region window, a p-electrode region window and a p-electrode wiring region window that are sequentially connected, and the n-electrode window region comprises an n-electrode conduction region window and an n-electrode wiring region window that are sequentially connected.

According to the present disclosure, by using the exposure technique and nitride etching process, the LED, the optical waveguide and the photodetector are transferred to the nitride device layer at the top layer; and the isolation trench is defined and the waveguide is etched from top to bottom in the trench region to the n-GaN layer to prevent mutual interference between the LED and the photodetector. By using various anisotropic silicon etching techniques, the silicon substrate layer and the expitaxial buffer layer under the device structure are removed, an ultra-thin device mono- lithically integrated with a suspended LED, an optical waveguide and a photodetector is obtained by further using the nitride back thinning etching technique.

Beneficial Effects

As compared with the prior art, the present disclosure has the following advantages:

In the device monolithically integrated with a suspended LED, an optical waveguide and a photodetector according to the present disclosure, as compared with integration of an LED, an optical waveguide and a photodetector that are made from different materials and isolated, the LED, the optical waveguide and the photodetector are integrated on the same chip. The LED emits light, planar waveguide transmission of photons and sensing of the photodetector are integrated on the same wafer. This simplifies the fabrication process, reduces the complexity, and solves the difficulty in monolithic integration of planar photons.

In the device according to the present disclosure, the light source, the optical waveguide and the photodetector are integrated on the same chip. Therefore, the light emitted by the LED is laterally coupled to the optical waveguide, transmitted over the optical waveguide, and detected by the photodetector at the other end of the optical waveguide, thereby achieving a planar photon monolithically integrated device.

In the device monolithically integrated with a suspended LED, an optical waveguide and a photodetector according to the present disclosure, the isolation trench isolates the LED as the light source from the photodetector in the plane, and mutual interference between devices is reduced.

In the device monolithically integrated with a suspended LED, an optical waveguide and a photodetector according to the present disclosure, the fabrication technique may be compatible with the silicon manufacturing technique. In this way, a planar photon integrated device oriented to optical communication and optical sensing in the visible light wavelength band may be achieved.

Reference signs and denotations thereof: 1—silicon substrate layer, 2—epitaxial buffer layer, 3—n-GaN, 4—n-electrode, 5—InGaN/GaN quantum well, 6—p-GaN layer, 7—p-electrode, 8—optical waveguide, 9—suspended p-electrode region, 10—p-electrode conductive region, 11—p-electrode wiring region, 12—n-electrode conductive region, and 13—n-electrode wiring region.

DETAILED DESCRIPTION

The present disclosure is further described with reference to the accompanying drawings and exemplary embodiments.

Figure 1:
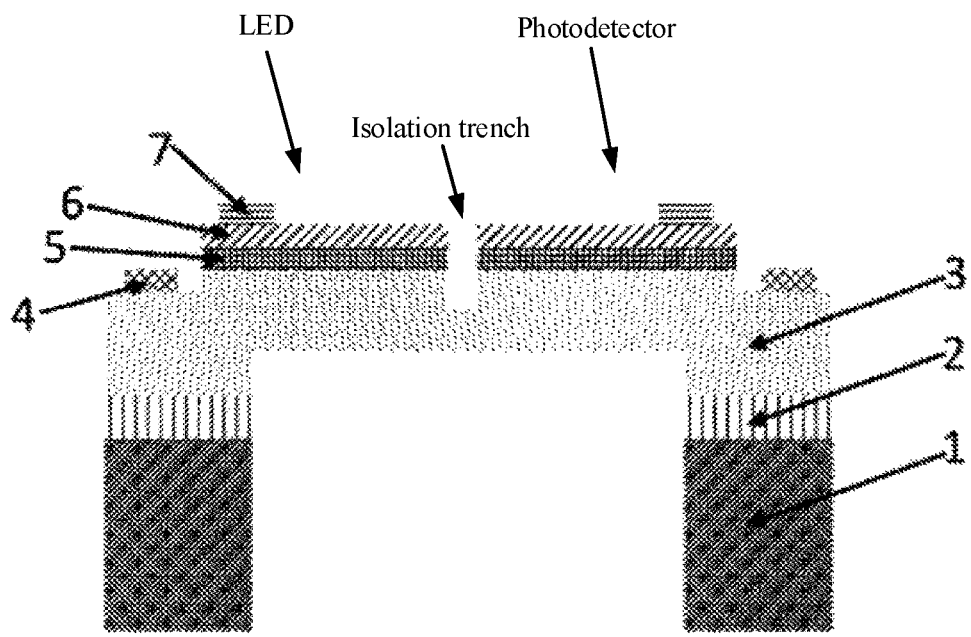
FIG. 1 is a schematic structural view of an integrated device monolithically integrated with a suspended LED, an optical waveguide and a photodetector according to an aspect the present disclosure.
Figure 2:
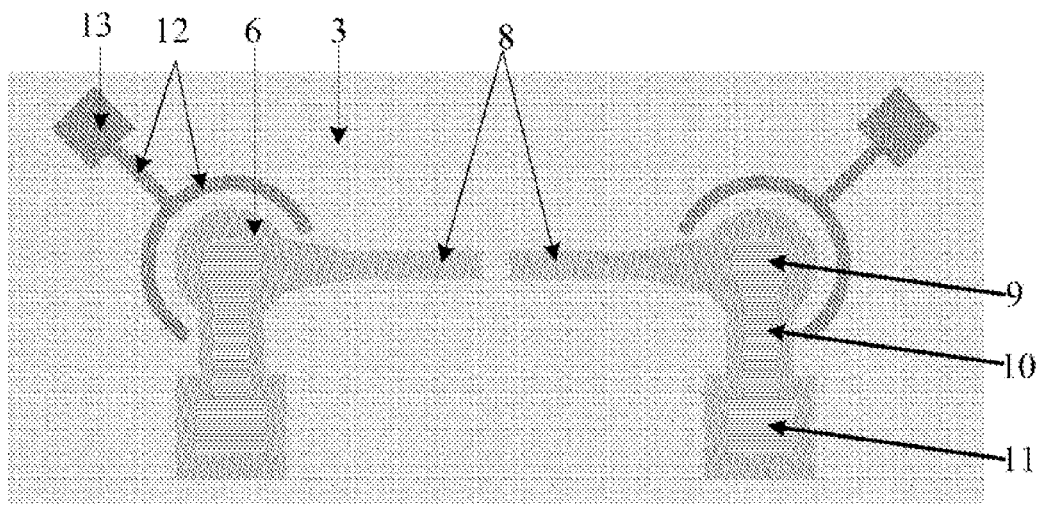
FIG. 2 is a top view of the device monolithically integrated with a suspended LED, an optical waveguide and a photodetector according to the present disclosure.
Figure 3:
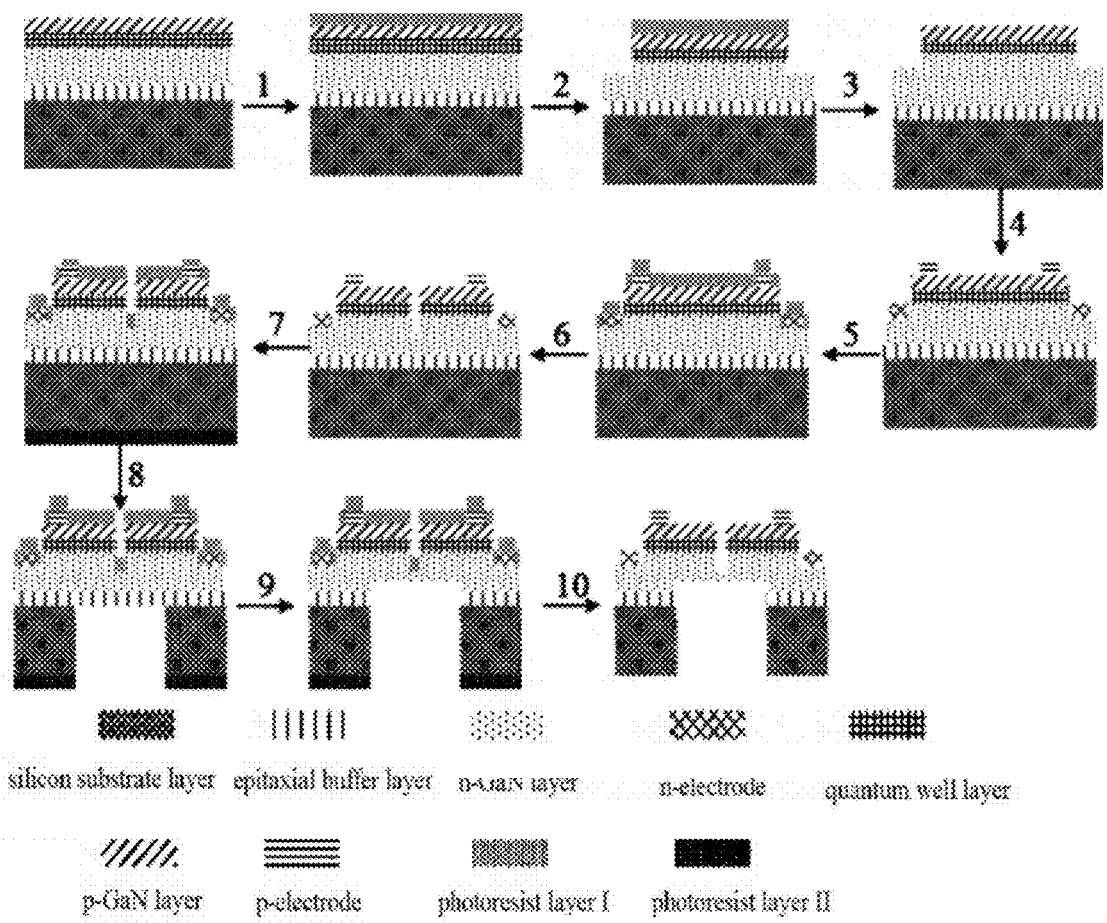
FIG. 3 is a flowchart of a method for fabricating the device monolithically integrated with a suspended LED, an optical waveguide and a photodetector according to another aspect the present disclosure.

FIG. 1 and FIG. 2 are schematic structural views of a device monolithically integrated with a suspended LED, an optical waveguide and a photodetector according to the present disclosure. FIG. 1 is a schematic structural view of an integrated device monolithically integrated with a suspended LED, an optical waveguide and a photodetector according to an aspect of the present disclosure. The device is carried on a silicon-based nitride wafer, and comprises: a silicon substrate layer 1, an epitaxial buffer layer 2 arranged on the silicon substrate layer 1, an LED device arranged on the epitaxial buffer layer 2 and a photodector.

FIG. 2 is a top view of the device monolithically integrated with a suspended LED, an optical waveguide and a photodetector according to the present disclosure. In FIG. 2, the LED and the photodetector are connected via an optical waveguide 8. In FIG. 1, the LED and the photodetector are both formed by a p-n junction, a p-electrode 7 and an n-electrode 4. For example, the p-n junction may include an n-GaN layer 3, an InGaN/GaN quantum well 5 and a p-GaN layer 6 that are sequentially connected from bottom to top, the p-electrode 7 is arranged on the p-GaN layer 6, a step-shaped stage is etched on an upper surface of the n-GaN layer 3. Here, the step-shaped stage may include an upper stage and a lower stage arranged on the upper stage, where the upper stage is connected to a bottom face of the InGaN/GaN quantum well 5. In FIG. 1, the n-electrode 4 is arranged on the lower stage; an isolation trench for dividing the optical waveguide into two parts is arranged on the optical waveguide 8, wherein one part is connected to the LED and the other part is connected to the photodetector, and a cavity opposite to the p-electrode 7, the n-electrode 4 and the optical waveguide 8 and passing through the silicon substrate layer 1 and the expitaxial buffer layer 2 to a bottom face of the n-GaN layer 3 is arranged below the n-GaN layer, such that the LED, the photodetector and the optical waveguide 8 are suspended. Further, in the device monolithically integrated with a suspended LED, an optical waveguide and a photodetector according to the present disclosure, the p-electrode 7 is formed by a suspended p-electrode region 9, a p-electrode conductive region 10 and a p-electrode wiring region 11 that are sequentially connected, and the n-electrode 4 is formed by an n-electrode conductive region 12 and an n-electrode wiring region 13 that are connected to each other, and the cavity is arranged under the optical waveguide 8 and the two suspended p-electrode region 9.

In the device monolithically integrated with a suspended LED, an optical waveguide and a photodetector according to the present disclosure, in the InGaN/GaN quantum well 5, InGaN and GaN are spacedly deposited to form a quantum layer.

In the device monolithically integrated with a suspended LED, an optical waveguide and a photodetector according to the present disclosure, the LED, the optical waveguide and the photodetector are all practiced on a nitride layer of the silicon-based nitride wafer, and the optical waveguide is connected to both the LED and the photodetector.

In the device monolithically integrated with a suspended LED, an optical waveguide and a photodetector according to the present disclosure, the isolation trench is formed by etching the optical waveguide 8 from the g-GaN layer 6 down to the n-GaN layer 3, and the isolated waveguide 8 is respectively connected to the LED and the photodetector.

In another exemplary embodiment of the present disclosure, the p-electrode and the n-electrode of the LED are both Ni/Au electrodes in which a deposited metal material is Ni/Au.

The method for fabricating the device monolithically integrated with a silicon substrate suspended LED, an optical waveguide and a photodetector according to the present disclosure comprises the following steps:

1) polishing to thin the silicon substrate layer 1 on the back of the silicon-based nitride wafer;
2) coating a photoresist layer on the upper surface of the silicon-based nitride wafer, and defining an optical waveguide region and an n-GaN step region on the photoresist layer by using exposure technique, wherein the n-GaN step region comprises a lower stage and an upper stage;
3) etching the n-GaN step region and the optical waveguide region by using a reactive ion beam;
4) removing the remaining photoresist to obtain a step-shaped stage, an optical waveguide 8, a p-GaN layer 6 arranged on an upper stage of the LED, a p-GaN layer 6 of the photodetector, an InGaN/GaN quantum well 5 of the LED, and an InGaN/GaN quantum well 5 of the photodetector;
5) uniformly coating a photoresist layer on an upper surface of the silicon-based nitride wafer, etching to define a p-electrode window region of the LED and a p-electrode window region of the photodetector that are arranged on the upper stage, an n-electrode window region of the LED and an n-electrode window region of the photodetector that are arranged on the lower stage, vapor depositing Ni/Au on the p-electrode window region and the n-electrode window region respectively to form an Ohmic contact and practice a p-electrode 7 and an n-electrode 4, and removing the remaining photoresist to obtain the LED and the photodetector;
6) uniformly coating a photoresist layer on the upper surface of the silicon-based nitride wafer, and etching in the optical waveguide region to define an isolation trench window region that is arranged between the LED and the photodetector and isolates the optical waveguide region;
7) etching from top to bottom the nitride layer to the n-GaN layer 3 to obtain an isolation trench by using a reactive ion beam;
8) coating an adhesive on a top layer of the silicon-based nitride wafer to protect the surface device from being damaged during etching, spin coating a photoresist layer on a lower surface of the silicon substrate layer 1 of the silicon-based nitride wafer, and defining a back etching window aligning with and totally covering the optical waveguide 8, the suspended p-electrode region 9 of the LED and the suspended p-electrode region 9 of the photodetector by the back alignment technique;
9) using the epitaxial buffer layer 2 as an etching barrier layer, and etching the silicon-based substrate layer 1 to a lower surface of the epitaxial buffer layer 2 to form a cavity via a back etching window by using the back deep silicon etching technique;
10) thinning the nitride on the epitaxial buffer layer 2 and the n-GaN layer 3 from bottom to top by using the nitride back thinning etching technique; and
11) removing the remaining photoresist to obtain the monolithically integrated device including the silicon-based substrate suspended LED, the optical waveguide and the photodetector.

Described above are merely exemplary embodiments of the present disclosure. It should be noted that persons of ordinary skill in the art would make various improvements and equivalent replacements to these embodiments without departing from the principle of the present disclosure. Technical solutions defined by these improvements and equivalent replacements shall all fall within the protection scope of the present disclosure.

What is claimed is:
1. An integrated device on a silicon-based nitride wafer, the integrated device comprising:

a silicon substrate layer, an epitaxial buffer layer arranged on the silicon substrate layer, a light-emitting diode (LED) device arranged on the epitaxial buffer layer, and a photodector;

wherein the LED and the photodetector are connected via an optical waveguide, and the LED and the photodetector are both formed by a p-n junction, a p-electrode, and an n-electrode;

wherein the p-n junction comprises an n-GaN layer, an InGaN/GaN quantum well and a p-GaN layer that are sequentially connected from bottom to top;

wherein the p-electrode is arranged on the p-GaN layer, a step-shaped stage is etched on an upper surface of the n-GaN layer, the step-shaped stage comprises an upper stage and a lower stage arranged on the upper stage, the upper stage is connected to a bottom face of the InGaN/GaN quantum well, and an n-electrode is arranged on the lower stage;

wherein the optical waveguide comprises an isolation trench that divides the optical waveguide into two parts: one part is connected to the LED and the other part is connected to the photodetector, wherein the first part and the other part are isolated from each other, and the isolation trench is formed by etching the optical waveguide from the p-GaN layer to the n-GaN layer; and wherein a cavity opposite to the p-electrode, the n-electrode and the optical waveguide and passing through the silicon substrate layer and the expitaxial buffer layer to a bottom face of the n-GaN layer is arranged below the n-GaN layer, such that the LED, the photodetector and the optical waveguide are suspended.

2. The integrated device according to claim 1, wherein the p-electrode comprises: a suspended p-electrode region, a p-electrode conductive region and a p-electrode wiring region that are sequentially connected, and the n-electrode is formed by an n-electrode conductive region and an n-electrode wiring region that are connected to each other, and the cavity is arranged under the optical waveguide and the two suspended p-electrode region.

3. The integrated device according to claim 1, wherein the LED, the optical waveguide and the photodetector are all on a nitride layer of the silicon-based nitride wafer.

4. The integrated device according to claim 1, wherein the p-electrode and the n-electrode are both Ni/Au electrodes in which a deposited metal material is Ni/Au.

* * * * *